(12) United States Patent  (10) Patent No.: US 6,965,134 B2
Mogamiya et al.  (45) Date of Patent: Nov. 15, 2005

(54) IMAGE PICK-UP UNIT INCLUDING AN IMAGE PICK-UP DEVICE AND OPTICAL FILTER LAYERS

(75) Inventors: Makoto Mogamiya, Tokyo (JP); Teruo Sakai, Saitama (JP)

(73) Assignee: PENTAX Corporation, Tokyo (JP)

( * ) Notice: Subject to any disclaimer, the term of this patent is extended or adjusted under 35 U.S.C. 154(b) by 0 days.

(21) Appl. No.: 10/715,449

(22) Filed: Nov. 19, 2003

(65) Prior Publication Data

US 2004/0104387 A1  Jun. 3, 2004

(30) Foreign Application Priority Data

Nov. 22, 2002  (JP) .............................. 2002-338966

(51) Int. Cl.$^7$ ...................... H01L 27/48; H01L 29/768; H01L 27/00; G03B 1/00
(52) U.S. Cl. ...................... 257/215; 257/226; 257/238; 250/208.1; 396/415; 396/429; 396/440
(58) Field of Search ............................... 257/215, 226, 257/238; 250/208.1; 396/429, 440, 415

(56) References Cited

U.S. PATENT DOCUMENTS

| | | | |
|---|---|---|---|
| 4,472,735 A | * | 9/1984 | Shinozaki et al. .......... 348/291 |
| 4,611,243 A | | 9/1986 | Morisawa et al. |
| 5,444,574 A | * | 8/1995 | Ono et al. ................... 359/708 |
| 5,648,653 A | * | 7/1997 | Sakamoto et al. ........ 250/208.1 |
| 5,739,855 A | * | 4/1998 | Centen et al. .............. 348/342 |
| 6,229,085 B1 | * | 5/2001 | Gotoh et al. ........... 174/35 MS |
| 6,374,060 B1 | * | 4/2002 | Mogamiya .................. 396/429 |
| 6,583,819 B2 | | 6/2003 | Ito et al. |
| 6,759,642 B2 | * | 7/2004 | Hoshino .................. 250/208.1 |
| 2001/0007475 A1 | | 7/2001 | Mogamiya et al. |
| 2001/0017663 A1 | * | 8/2001 | Yamaguchi et al. ........ 348/373 |

FOREIGN PATENT DOCUMENTS

| | | | | | |
|---|---|---|---|---|---|
| JP | 60169801 A | * | 9/1985 | ............ | G02B 5/20 |
| JP | 62189408 A | * | 8/1987 | ............ | G02B 6/12 |
| JP | 07020312 A | * | 1/1995 | ............ | G02B 5/22 |
| JP | 11-218612 | | 8/1999 | | |
| JP | 2001-284561 | | 10/2001 | | |

* cited by examiner

*Primary Examiner*—Long Pham
*Assistant Examiner*—Shrininvas H. Rao
(74) *Attorney, Agent, or Firm*—Greenblum & Bernstein, P.L.C.

(57) ABSTRACT

An image pick-up unit includes an image pick-up device; and a plurality of optical filters which are cemented together in layers and positioned in front of the image pick-up device. At least two optical filters among the plurality of optical filters, which have different optical properties, are different in shape from each other.

19 Claims, 7 Drawing Sheets

PRIOR ART

IMAGE PICK-UP UNIT INCLUDING AN IMAGE PICK-UP DEVICE AND OPTICAL FILTER LAYERS

BACKGROUND OF THE INVENTION

1. Field of the Invention

The present invention relates to an image pick-up unit which includes an image pick-up device and optical filter layers positioned in front of the image pick-up device. The image pick-up unit is suitable for an electronic camera having a focal plane shutter such as electronic SLR camera.

2. Description of the Related Art

In electronic apparatuses using a solid-state image pick-up device (e.g., CCD or CMOS) such as digital still cameras or digital video cameras, it is generally the case that a cemented optical element, consisting of at least one absorptive type of infrared (IR) cut-off filter and at least one optical low-pass filter which are cemented to each other, is disposed between an image pick-up lens (e.g., photographing lens) and the solid-state image pick-up device.

Figure 9:
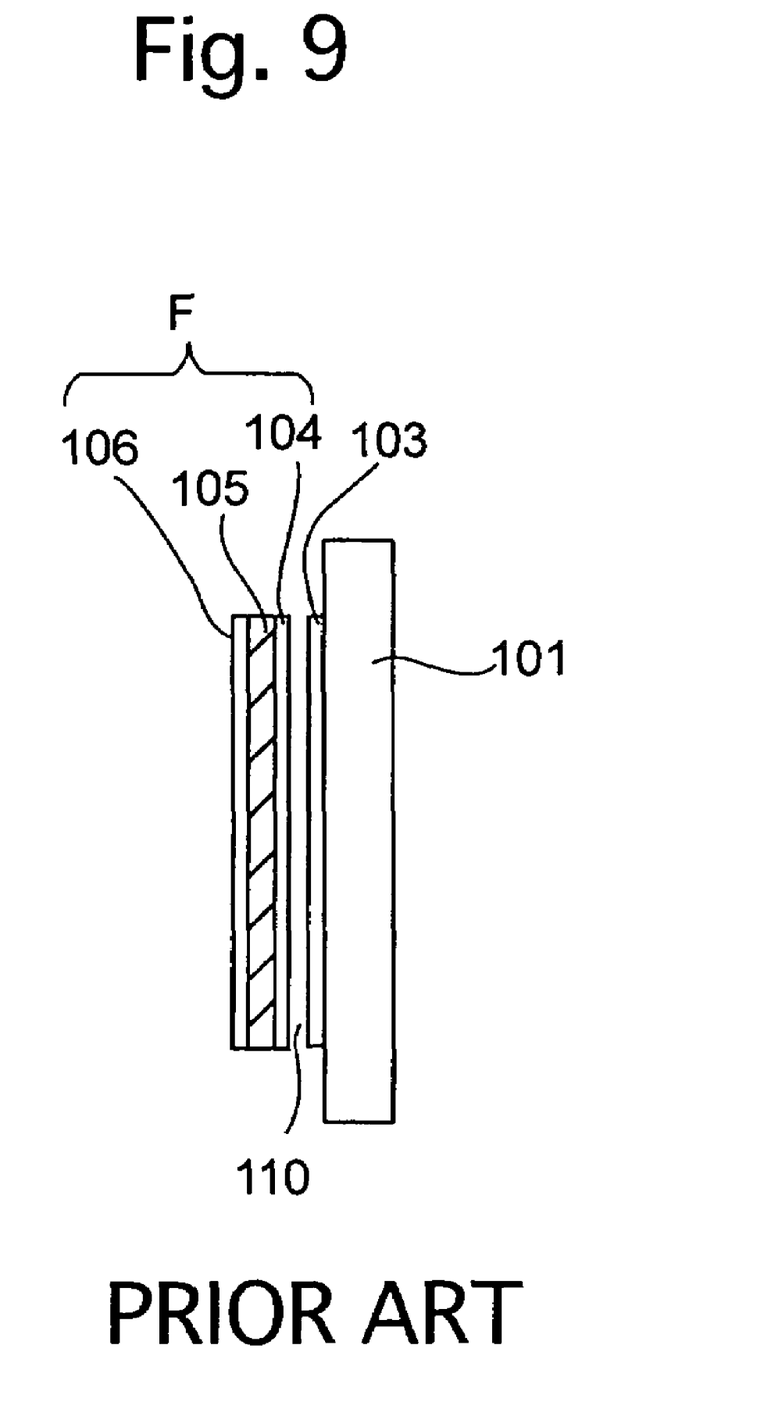
FIG. 9 is a side elevational view of a conventional image pick-up device and a multilayer optical filter positioned in front of the image pick-up device.

FIG. 9 shows an arrangement of a conventional image pick-up device and associated optical elements. In a conventional image pick-up device 101 (CCD or CMOS package), a cover glass 103 is cemented to a front surface of a package of the image pick-up device 101 to cover the front of the image pick-up device 101 in an airtight fashion. A multilayer optical filter F having a first optical low-pass filter 106, an infrared cut-off filter 105 and a second optical low-pass filter 104, which are cemented together and arranged in that order from the object side (left side as viewed in FIG. 9), is positioned in front of the cover glass 103. The first optical low-pass filter 106 is cemented to the front of the infrared cut-off filter 105 while the second optical low-pass filter 104 is cemented to the rear of the infrared cut-off filter 105. The multilayer optical filter F is positioned in front of the cover glass 103 with a space 110 between the second optical low-pass filter 104 and the cover glass 103.

In the case where the image pick-up device 101 and the multilayer optical filter F are incorporated in a camera body of a conventional SLR camera which uses a silver-salt film, it is difficult to design each of the first optical low-pass filter 106, the infrared cut-off filter 105 and the second optical low-pass filter 104 because the distance between the focal plane shutter and the image pick-up device 101 is narrow.

To this end, the inventors of the present invention have proposed a Japanese Unexamined Patent Publication No. 2001-284561 in which optical filters corresponding to the aforementioned optical filters 104, 105 and 106 are cemented together to be formed as a multilayer optical filter which is cemented to a cover glass corresponding to the aforementioned cover glass 103. In this case, if each of the optical filters corresponding to the aforementioned optical filters 104, 105 and 106 is formed as thin as possible, the strength of each optical filter becomes low, while it becomes difficult to distinguish between the front side and the rear side of each optical filter. Some expertise is also required to cement the optical filters together.

SUMMARY OF THE INVENTION

The present invention provides an image pick-up unit which includes an image pick-up device and layers of optical filters positioned in front of the image pick-up device, wherein the design freedom of the layers of optical filters fixed to the front of the image pick-up device is increased while the image pick-up unit can be easily manufactured.

According to an aspect of the present invention, an image pick-up unit is provided, including an image pick-up device; and a plurality of optical filters which are cemented together in layers and positioned in front of the image pick-up device. At least two optical filters among the plurality of optical filters, which have different optical properties, are different in shape from each other.

It is desirable for each optical filter of the plurality of optical filters to be asymmetrical with respect to a center of the each optical filter.

It is desirable for the plurality of optical filters to be formed so that general outer shapes thereof are geometrically similar to each other. Each optical filter of the plurality of optical filters has at least four corners, each of which is cut out by a predetermined amount. Each of the plurality of optical filters is formed so that at least one of the four corners is cut out by an amount different from an amount cutout of each of remaining corners of the four corners.

It is desirable for the plurality of optical filters to be formed so that general outer dimensions thereof are the same.

It is desirable for the plurality of optical filters to be formed so that general outer shapes thereof are geometrically similar to each other. Each optical filter of the plurality of optical filters has at least four corners each of which is cut out by a predetermined amount. Each of the plurality of optical filters except for at least one thereof is formed so that at least one of the four corners is cut out by an amount different from an amount cutout of each of remaining corners of the four corners.

It is desirable for the plurality of optical filters to be formed so that general outer dimensions thereof are the same.

It is desirable for the plurality of optical filters to be formed so that general outer shapes thereof are geometrically similar to each other. Each of the plurality of optical filters includes one of a projection and a recess on an outer edge of the each optical filter which does not overlap another optical filter of the plurality of optical filters when the plurality of optical filters are cemented together in layers.

It is desirable for the plurality of optical filters to be formed so that general outer dimensions thereof are the same.

It is desirable for the plurality of optical filters to be formed so that general outer shapes thereof are geometrically similar to each other. Each of the plurality of optical filters except for at least one thereof includes one of a projection and a recess on an outer edge of the each optical filter which does not overlap another optical filter of the plurality of optical filters when the plurality of optical filters are cemented together in layers.

It is desirable for the plurality of optical filters to be formed so that general outer dimensions thereof are the same.

It is desirable for an optical filter of the plurality of optical filters, which is positioned closest to the image pick-up device, to include an infrared cut-off glass serving as a cover glass for covering the front of the image pick-up device to seal the image pick-up device, and for each optical filter of the plurality of optical filter except for the infrared cut-off glass to include an optical low-pass filter.

It is desirable for a rear surface of one of the plurality of optical filters which is cemented to a front surface of the infrared cut-off glass to be coated with an optical matched filter coating, and for at least one surface of remaining surfaces of the plurality of optical filters to be coated with an anti-reflection coating.

It is desirable for the length and width of each optical filter of the plurality of optical filters, except for the infrared cut-off glass, to be equal to or less than the length and width of the infrared cut-off glass, respectively.

It is desirable for a thickness of each optical filter of the plurality of optical filters, except for the infrared cut-off glass, to be one of equal to or less than approximately 0.3 mm. Outer dimensions of the plurality of optical filters, except for the infrared cut-off glass, decrease stepwise in a direction from the infrared cut-off glass toward a side from which incoming light is incident on the image pick-up device.

It is desirable for each optical filter of the plurality of optical filters to be made of one of the following birefringent glass materials: quartz, lithium niobate and lithium triborate.

It is desirable for the plurality of optical filters, which are cemented together in layers, to be cemented to the image pick-up device.

It is desirable for each optical filter of the plurality of optical filters to be substantially rectangular in shape, each of four corners of the each optical filter being chamfered.

In another embodiment, an image pick-up unit is provided, including an image pick-up device; and a plurality of optical filters which are made of cemented layers of optical material, and positioned immediately in front of the image pick-up device. The length and width of at least one optical filter of the plurality of optical filters are different from the length and width of another optical filter of the plurality of optical filters.

The present disclosure relates to subject matter contained in Japanese Patent Application No. 2002-338966 (filed on Nov. 22, 2002) which is expressly incorporated herein by reference in its entirety.

BRIEF DESCRIPTION OF THE DRAWINGS

The present invention will be described below in detail with reference to the accompanying drawings in which.

DESCRIPTION OF THE PREFERRED EMBODIMENTS

Figure 1:
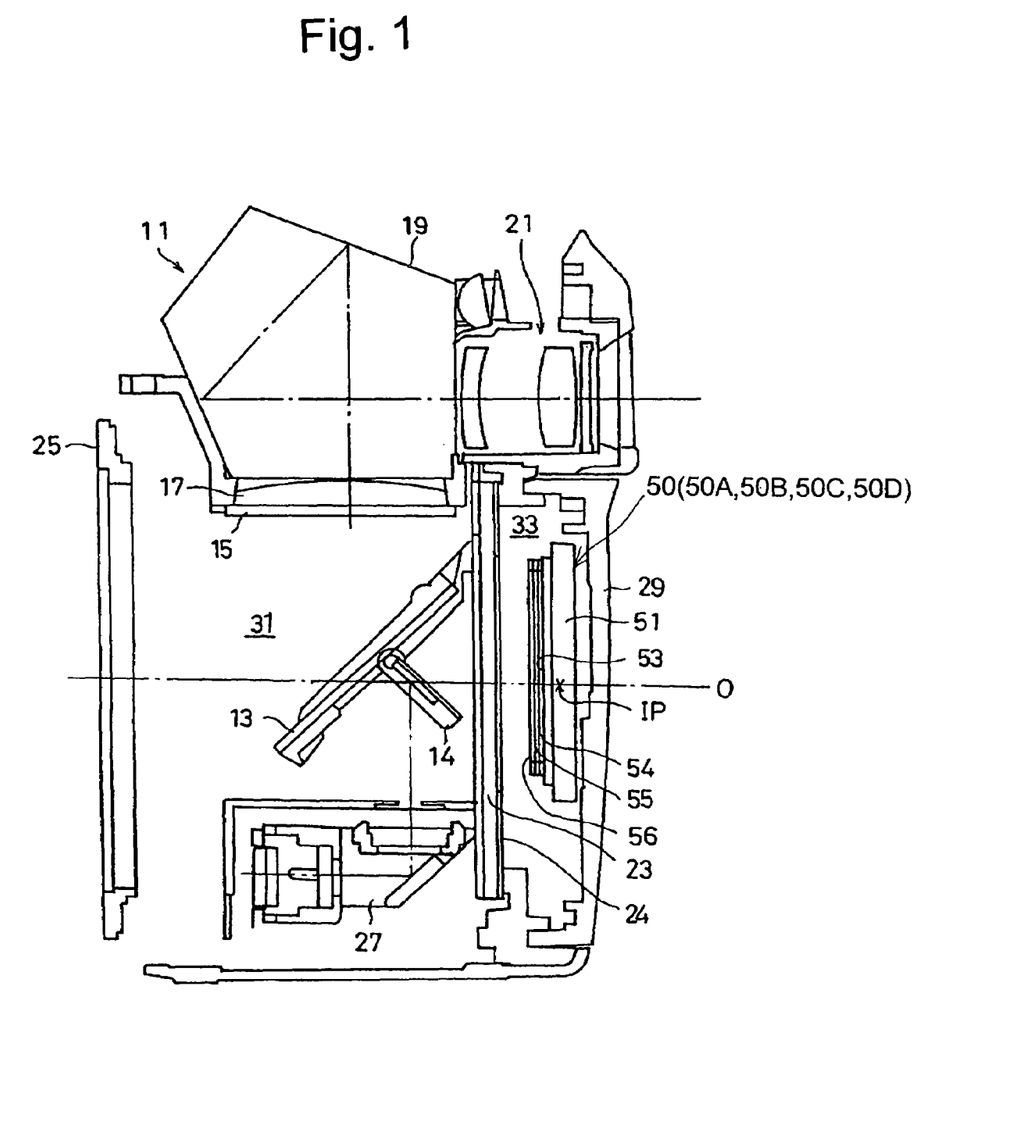
FIG. 1 is a longitudinal cross sectional view of an electronic SLR camera body in which an embodiment of an image pick-up unit according to the present invention is incorporated, showing fundamental elements of the camera body.

As shown in FIG. 1, an electronic SLR camera body 11 is provided on front thereof with a mount ring 25 to which an interchangeable photographing lens (not shown) is detachably-mounted. Light rays which are passed through the photographing lens are reflected upward by a quick-return mirror 13, when the quick-return mirror 13 is in a viewing position (initial position), to pass through a focusing screen 15 which lies in a plane which is provided at a positive optically equivalent to an image point (design image point) IP formed through the photographing lens L. Subsequently, the light rays which are passed through the focusing screen 15 are concentrated through a condenser lens 17, and are reflected by a pentagonal prism (erecting system) 19 to exit from an eyepiece 21. The user views the image focused on the focusing screen 15 as erect image via the eyepiece 21, the pentagonal prism 19 and the condenser lens 17.

A central portion of the quick-return mirror 13 is formed as a half mirror portion. When the quick-return mirror 13 is in the viewing position, a sub-mirror 14, which is pivoted on a pivot fixed to the rear side of the quick-return mirror 13, reflects a light bundle incident thereon, which is passed through the half mirror portion, downwards toward an AF sensor unit 27. The AF sensor unit 27 is a conventional phase-difference detection type which detects an in-focus state from a pair of images respectively formed on a pair of line sensors by two light bundles which are respectively passed through two different pupil areas positioned at points optically equivalent to the image point IP. Each line sensor includes an array of photodiodes (array of light receiving elements), and each photodiode accumulates (integrates) an electric charge for a predetermined amount of time in accordance with the brightness of the object image formed on the photodiode. The accumulated electric charges are read out of the photodiodes to be converted into a video signal (luminance distribution signal) for each line sensor. This video signal is input to a CPU (MPU; not shown) provided in the camera body 11. The CPU determines a phase difference between the pair of object images respectively formed on the pair of line sensors, using an algorithm according to a phase difference detecting method known in the art, to calculate a focus state (defocus amount) using the determined phase difference.

The camera body 11 is provided therein with a focal plane shutter composed of a set of focal-plane shutter blades (blinds) 23 which are positioned on the object side (left side as viewed in FIG. 1) of the image point IP with a gap between the set of focal-plane shutter blades 23 and the image point IP. The camera body 11 is provided behind the set of focal-plane shutter blades 23 with an image pick-up unit 50 which includes an image pick-up device (CCD package) 51. The image pick-up device 51 is positioned so that the axial position of the sensitive surface of the image pick-up device 51 is coincident with the image point IP in the direction of an optical axis O of the photographing lens. The camera body 11 is provided therein between the quick-return mirror 13 and the image pick-up unit 50 with a shutter support frame 24 which is positioned immediately behind the set of focal-plane shutter blades 23 to support the set of focal-plane shutter blades 23. The shutter support frame 24 has a rectangular aperture for allowing the light bundle which is passed through the photographing lens to be incident on the image pick-up unit 50 upon a shutter release, i.e., at the time the set of focal-plane shutter blades 23 are open. The shutter support frame 24 divides an internal space of the camera body 11 into two: a mirror accommodation space 31 for accommodating the quick-return mirror 13 and other components, and an image pick-up unit accommodating space 33 for accommodating the image pick-up unit 50. A back wall 29 of the camera body 11 which forms a portion of the exterior wall of the camera body 11 makes the image pick-up unit accommodating space 33 a light-tight space between the shutter support frame 24 and the back wall 29 in a state where the set of focal-plane shutter blades 23 are closed. The shutter support frame 24 supports outer edges of the focal-plane shutter blades 23 to shield the outer edges thereof in a light-tight fashion so that no light is incident on the image pick-up unit accommodating space 33 in a state where the set of focal-plane shutter blades 23 are closed. When the set of focal-plane shutter blades 23 are fully open, the shutter support frame 24 forms the limits of each frame exposed.

In the camera body 11, upon a shutter release, the quick-return mirror 13 moves upwards and the set of focal-plane shutter blades 23 open so that an object image is formed on the sensitive surface of the image pick-up device 51. The object image formed on the sensitive surface of the image pick-up device 51 is converted into electrical charges via photoelectronic conversion elements of the image pick-up device 51, and the electrical charges are accumulated therein. The accumulated electrical charges are read out from the image pick-up device 51 as electrical signals by the aforementioned CPU to be image-processed in a predetermined manner immediately after the set of focal-plane shutter blades 23 are closed.

The basic structure of the present embodiment of the electronic SLR camera body has been described above. The image pick-up unit 50 devised according to the present invention will be hereinafter discussed in detail with reference to FIGS. 2 through 7.

In general, a square separation pattern is currently used as a separation pattern for effectively eliminating moires (moire fringes). In this case, it is necessary to use a combination of three optical low-pass filters to eliminate moires. To this end, each of the following three embodiments (first through third embodiments) of the image pick-up units is provided with a combination of three optical low-pass filters. However, each of the following three embodiments of the image pick-up units can be provided with a combination of only two optical low-pass filters or a single optical low-pass filter to reduce the cost of production. In this case, the moires which are not eliminated through the one or two optical low-pass filters can be eliminated by software. If desired, more than three optical low-pass filters can be used to eliminate moires.

Figure 2:
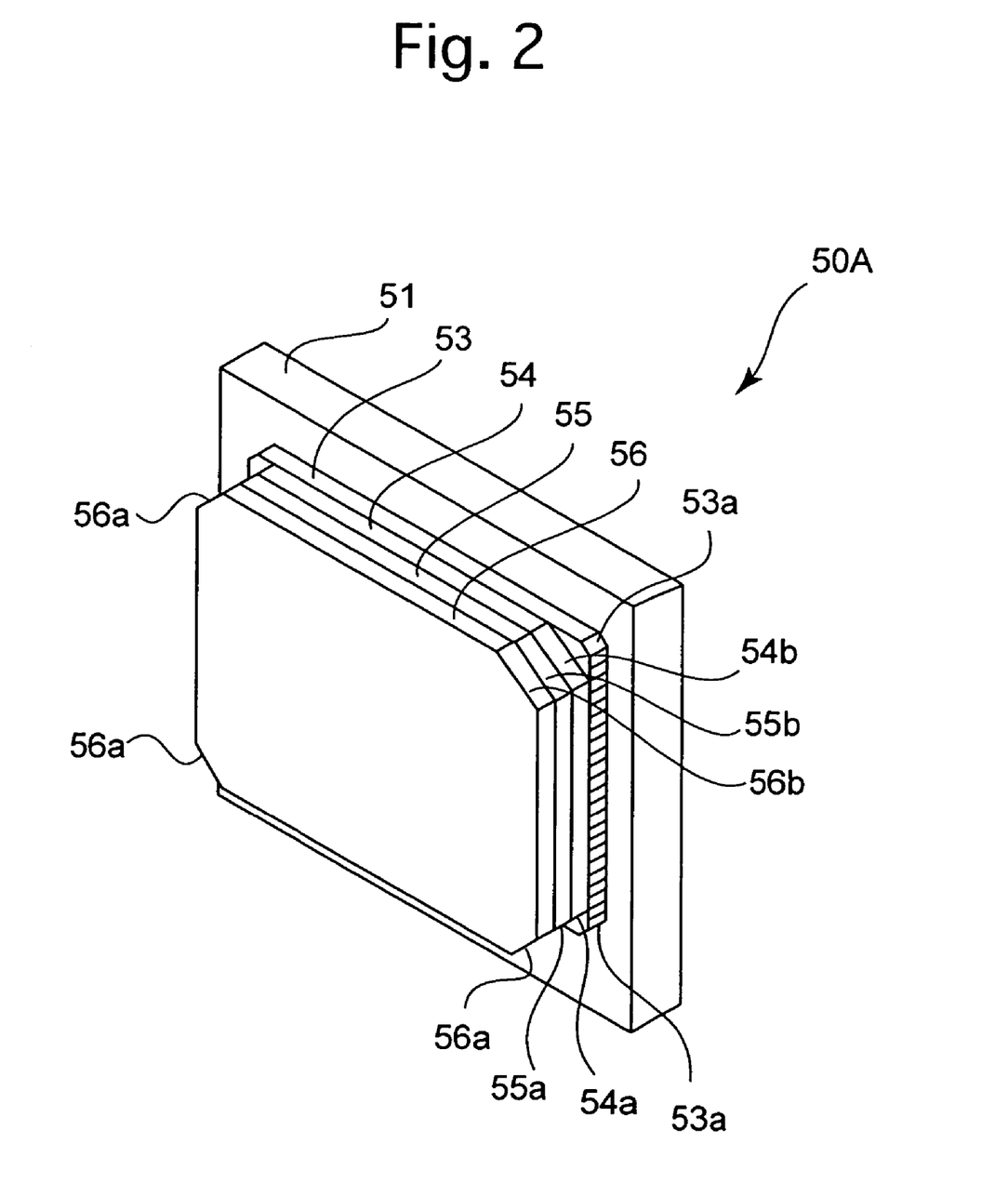
FIG. 2 is a perspective view of a first embodiment of the image pick-up unit according to the present invention.
Figure 3A:
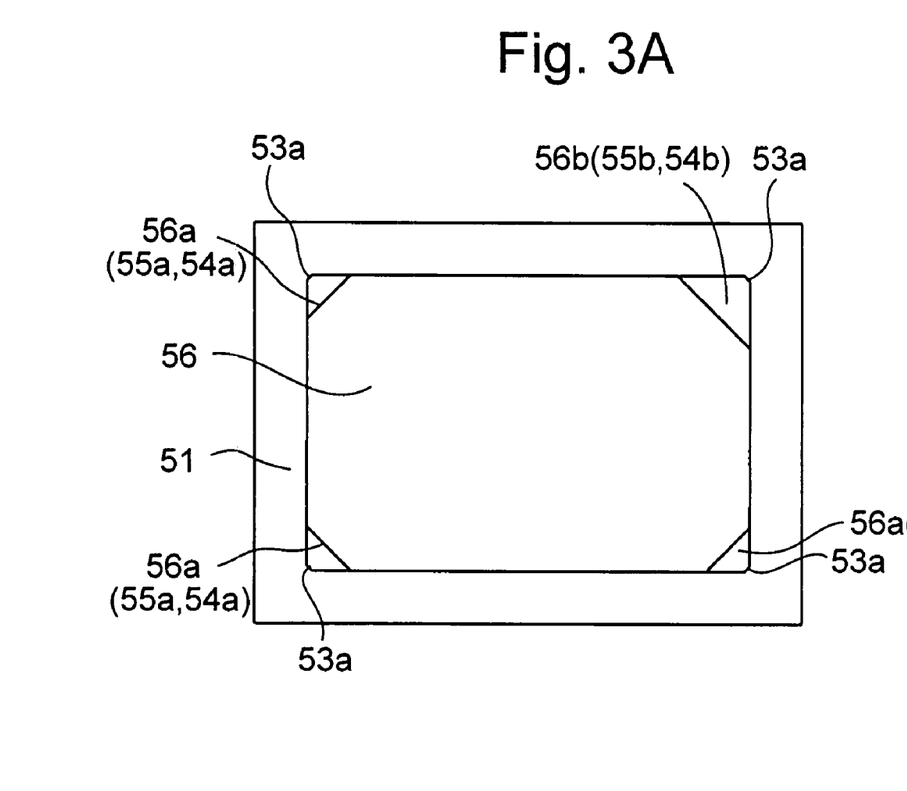
FIG. 3A is a front elevational view of the first embodiment of the image pick-up unit shown in FIG. 2.
Figure 3B:
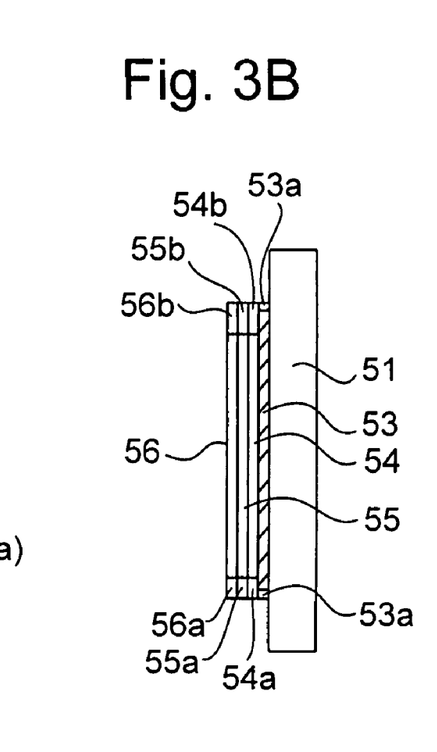
FIG. 3B is a side elevational view of the first embodiment of the image pick-up unit shown in FIG. 2, seen from the right side of the image pick-up unit.

FIGS. 2 and 3A and 3B show the first embodiment of the image pick-up unit 50 (50A) according to the present invention. The image pick-up unit 50A is provided with an infrared cut-off glass (infrared cut-off filter) 53 which is fixed to a front surface of the CCD package of the image pick-up device 51 by adhesive to seal the image pick-up device 51. The infrared cut-off glass 53 serves not only as an infrared cut-off filter, but also as a cover glass for covering the front of the image pick-up device 51. The image pick-up unit 50A is provided immediately in front of the infrared cut-off glass 53 with a multilayer optical low-pass filter which is cemented to a front surface of the infrared cut-off glass 53. This multilayer optical low-pass filter includes three optical low-pass filters: a rear optical low-pass filter 54, a middle optical low-pass filter 55 cemented to a front surface of the rear optical low-pass filter 54, and a front optical low-pass filter 56 cemented to a front surface of the middle optical low-pass filter 55. Each of the three optical low-pass filters 54, 55 and 56 is formed so that the shape of each optical low-pass filter is asymmetrical with respect to a straight line passing through the center of the optical low-pass filter to specify front and rear sides of each optical low-pass filter and also a proper orientation of each low-pass filter. This will be further discussed in detail hereinafter.

All four corners 53a of the infrared cut-off glass 53 are chamfered in the same manner so that the surface of each chamfered corner 53a is flat. Accordingly, the lengths of the flat surfaces of the four chamfered corners 53a are the same. The general outer shape of the infrared cut-off glass 53 is rectangular, and also the general outer shape of each of the three optical low-pass filters 54, 55 and 56 is rectangular so as to be the same as the general outer shape of the infrared cut-off glass 53.

All four corners of each of the three optical low-pass filters 54, 55 and 56 are chamfered so that the surface of each chamfered corner is flat. Three chamfered corners (a bottom right-hand corner, a top left-hand corner and a bottom left-hand corner as viewed in FIGS. 2 and 3A) 54a among the four chamfered corners of the rear optical low-pass filter 54 are chamfered so that the length of the flat surface of each chamfered corner 54a is greater than the length of the flat surface of each chamfered corner 53a of the infrared cut-off glass 53. The remaining chamfered corner (top right-hand corner as viewed in FIG. 3A) 54b is chamfered (cut out) so that the length of the flat surface of the chamfered corner 54b is greater than the length of the flat surface of each chamfered corner 54a.

Likewise, three chamfered corners (a bottom right-hand corner, a top left-hand corner and a bottom left-hand corner as viewed in FIGS. 2 and 3A) 55a among the four chamfered corners of the middle optical low-pass filter 55 are chamfered so that the length of the flat surface of each chamfered corner 55a is greater than the length of the flat surface of each chamfered corner 53a of the infrared cut-off glass 53. The remaining one chamfered corner (top right-hand corner as viewed in FIG. 3A) 55b is chamfered (cut out) so that the length of the flat surface of the chamfered corner 55b is greater than the length of the flat surface of each chamfered corner 55a.

Likewise, three chamfered corners (a bottom right-hand corner, a top left-hand corner and a bottom left-hand corner as viewed in FIGS. 2 and 3A) 56a among the four chamfered corners of the front optical low-pass filter 56 are chamfered so that the length of the flat surface of each chamfered corner 56a is greater than the length of the flat surface of each chamfered corner 53a of the infrared cut-off glass 53. The remaining one chamfered corner (top right-hand corner as viewed in FIGS. 2 and 3A) 56b is chamfered (cut out) so that the length of the flat surface of the chamfered corner 56b is greater than the length of the flat surface of each chamfered corner 56a.

The length of the flat surfaces of the chamfered corners 54a, the chamfered corners 55a, and the chamfered corners 56a are the same, while the length of the flat surfaces of the chamfered corner 54b, the chamfered corner 55b, and the chamfered corner 56b are the same.

The rear surface of the middle optical low-pass filter 55 is cemented to the front surface of the rear optical low-pass filter 54, and the rear surface of the front optical low-pass filter 56 is cemented to the front surface of the middle optical low-pass filter 55, and the rear surface of the rear optical low-pass filter 54 is cemented to a front surface of the infrared cut-off glass 53.

Although the general outer shapes of the three optical low-pass filters 54, 55 and 56, which are fixed to the infrared cut-off glass 53 by adhesive, are the same as described above, a specific corner (54b, 55b or 56b) of each of the three optical low-pass filters 54, 55 and 56 is formed to have a shape different from the shapes of the remaining three corners (54a, 55a or 56a). This makes it easy to distinguish between the front surface and the rear surface of each low-pass filter and to know a proper orientation of each low-pass filter when the infrared cut-off glass 53 and the three optical low-pass filters 54, 55 and 56 are cemented together. Consequently, the three optical low-pass filters 54, 55 and 56 are prevented from being cemented together mistakenly with wrong sides thereof being cemented to each other in wrong orientation.

The rear surface of rear optical low-pass filter 54, which is cemented to a front surface of the infrared cut-off glass 53, is coated with an optical matched filter coating. Furthermore, at least one surface of remaining surfaces of the three optical low-pass filters 54, 55 and 56 (desirably on the incident surface of the front optical low-pass filter 56 which is closest to the object side) is coated with an anti-reflection coating.

Figure 4:
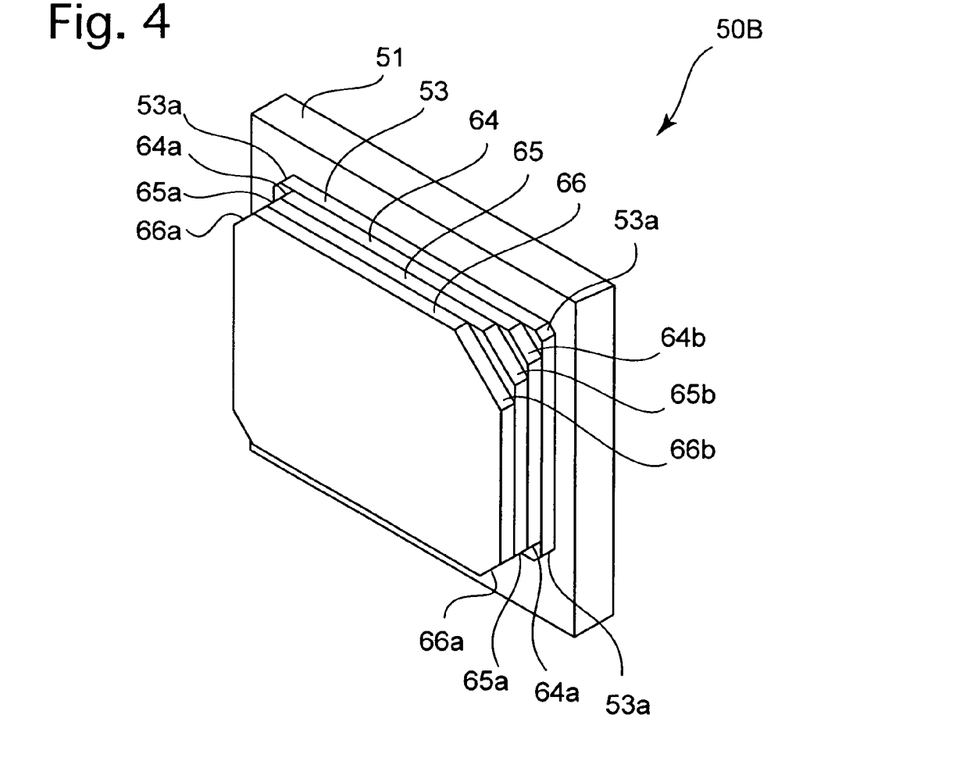
FIG. 4 is a perspective view of a second embodiment of the image pick-up unit according to the present invention.
Figure 5A:
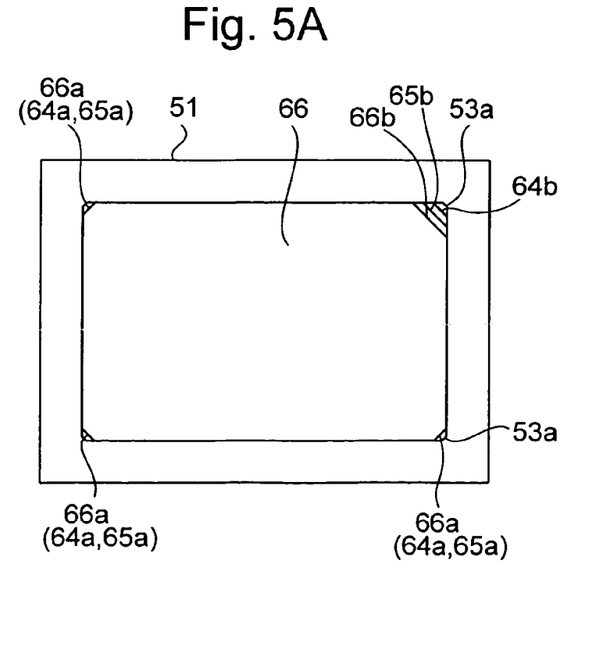
FIG. 5A is a front elevational view of the second embodiment of the image pick-up unit shown in FIG. 4.
Figure 5B:
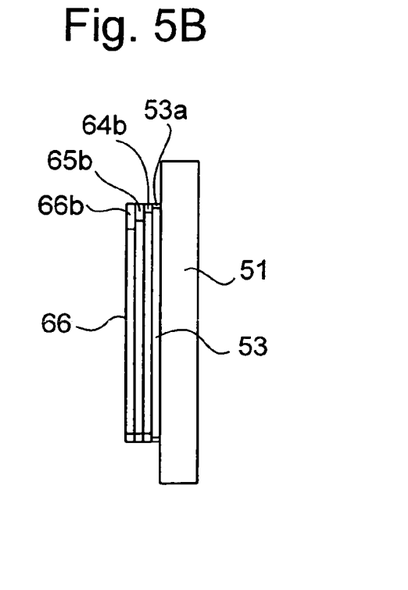
FIG. 5B is a side elevational view of the second embodiment of the image pick-up unit shown in FIG. 4, seen from the right side of the image pick-up unit.

In the above described first embodiment of the image pick-up unit, the outside shapes of the three optical low-pass filters 54, 55 and 56 are substantially the same, and the orientation of each of the optical low-pass filters 54, 55 and 56 can be easily determined. FIGS. 4, 5A and 5B show the second embodiment of the image pick-up unit 50 (50B) according to the present invention, wherein the outside shapes of the three optical low-pass filters 54, 55 and 56 can be easily distinguished from each other. The image pick-up device and the infrared cut-off glass serving as a cover glass in the image pick-up unit 50B of the second embodiment have the same structures as those in the image pick-up unit 50A of the first embodiment, and are accordingly designated by the same reference numerals.

Similar to the image pick-up unit 50A of the first embodiment, the image pick-up unit 50B of the second embodiment is provided immediately in front of the infrared cut-off glass 53 with a multilayer optical low-pass filter which is cemented to a front surface of the infrared cut-off glass 53. This multilayer optical low-pass filter includes three optical low-pass filters: a rear optical low-pass filter 64, a middle optical low-pass filter 65 cemented to a front surface of the rear optical low-pass filter 64, and a front optical low-pass filter 66 cemented to a front surface of the middle optical low-pass filter 65. Each of the three optical low-pass filters 64, 65 and 66 is formed so that the shape of each optical low-pass filter is asymmetrical with respect to a straight line passing through the center of the optical low-pass filter.

The general outer shape of each of the three optical low-pass filters 64, 65 and 66 is rectangular so as to be the same as the general outer shape of the infrared cut-off glass 53. All four corners of each of the three optical low-pass filters 64, 65 and 66 are chamfered so that the surface of each chamfered corner is flat.

Three chamfered corners (a bottom right-hand corner, a top left-hand corner and a bottom left-hand corner as viewed in FIGS. 4 and 5A) 64a among the four chamfered corners of the rear optical low-pass filter 64 are chamfered so that the length of the flat surface of each chamfered corner 64a is greater than the length of the flat surface of each chamfered corner 53a of the infrared cut-off glass 53. The remaining one chamfered corner (top right-hand corner as viewed in FIG. 5A) 64b is chamfered (cut out) so that the length of the flat surface of the chamfered corner 64b is greater than the length of the flat surface of each chamfered corner 64a.

Three chamfered corners (a bottom right-hand corner, a top left-hand corner and a bottom left-hand corner as viewed in FIGS. 4 and 5A) 65a among the four chamfered corners of the middle optical low-pass filter 65 are chamfered so that the length of the flat surface of each chamfered corner 65a is greater than the length of the flat surface of each chamfered corner 53a of the infrared cut-off glass 53. The remaining one chamfered corner (top right-hand corner as viewed in FIG. 5A) 65b is chamfered (cut out) so that the length of the flat surface of the chamfered corner 65b is greater than the length of the flat surface of the chamfered corner (top right-hand corner as viewed in FIG. 5A) 64b of the rear optical low-pass filter 64.

Three chamfered corners (a bottom right-hand corner, a top left-hand corner and a bottom left-hand corner as viewed in FIGS. 4 and 5A) 66a among the four chamfered corners of the front optical low-pass filter 66 are chamfered so that the length of the flat surface of each chamfered corner 66a is greater than the length of the flat surface of each chamfered corner 53a of the infrared cut-off glass 53. The remaining one chamfered corner (top right-hand corner as viewed in FIGS. 4 and 5A) 66b is chamfered (cut out) so that the length of the flat surface of the chamfered corner 66b is greater than the length of the flat surface of the chamfered corner (top right-hand corner as viewed in FIGS. 4 and 5A) 65b of the middle optical low-pass filter 65.

The length of the flat surfaces of the chamfered corners 64a, the chamfered corners 65a, and the chamfered corners 66a are the same.

Since the length of the flat surface of the chamfered corner 64b is greater than the length of the flat surface of each chamfered corner 64a, which is greater than the length of the flat surface of each chamfered corner 53a, and since the length of the flat surface of the chamfered corner 65b is greater than the length of the flat surface of the chamfered corner 64b, and since the length of the flat surface of the chamfered corner 66b is greater than the length of the flat surface of the chamfered corner 65b as described above, it can be understood that the chamfered corner 64b of the rear optical low-pass filter 64, the chamfered corner 65b of the middle optical low-pass filter 65 and the chamfered corner 66b of the rear optical low-pass filter 66 are chamfered (cut out) to have a stepped configuration which steps down, toward the optical axis O, in a direction from the infrared cut-off glass 53 side to the photographing lens mounted to the mount 25 (i.e., in the direction from left to right as viewed in FIG. 5A) in a state where the three optical low-pass filters 64, 65 and 66 are cemented together as shown in FIGS. 4, 5A and 5B. Since the chamfered corner 64b of the rear optical low-pass filter 64, the chamfered corner 65b of the middle optical low-pass filter 65 and the chamfered corner 66b of the rear optical low-pass filter 66 are chamfered to have the above described stepped configuration when the rear optical low-pass filter 64, the middle optical low-pass filter 65 and the rear optical low-pass filter 66 are cemented together with the three chamfered corners 64a, the three chamfered corners 65a and the three chamfered corners 66a being aligned, it is easy to distinguish between the front surface and the rear surface of each low-pass filter, to know the correct orientation of each low-pass filter and to determine the order of placement of the three optical low-pass filters 64, 65 and 66 when the infrared cutoff glass 53 and the three low-pass filters 64, 65 and 66 are cemented together. Consequently, the optical low-pass filters 64, 65 and 66 are prevented from being cemented together mistakenly with wrong sides thereof being cemented to each other in wrong orientation.

Figure 6:
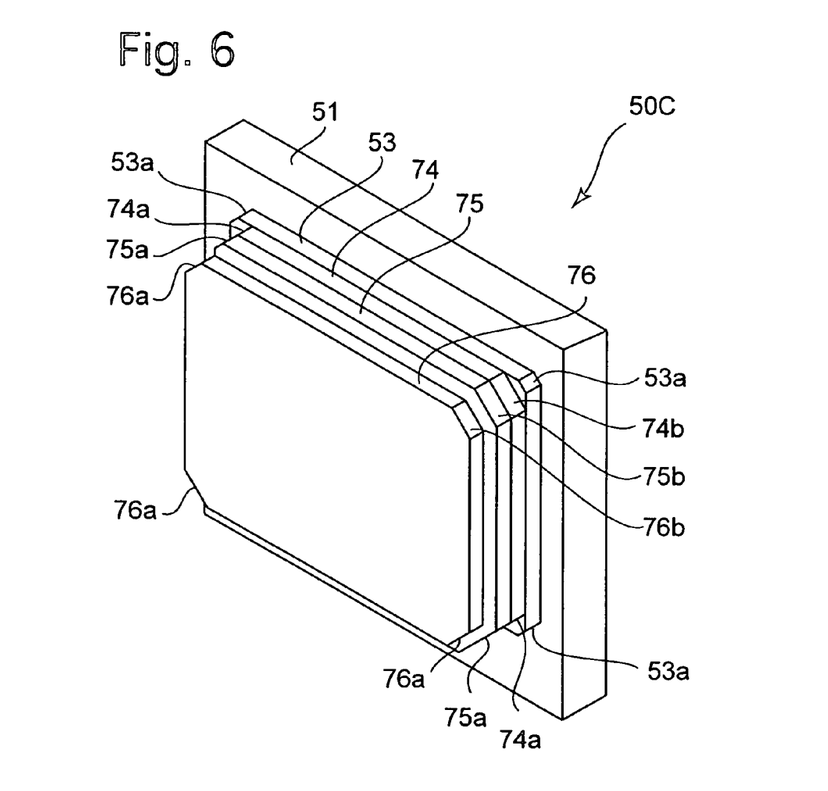
FIG. 6 is a perspective view of a third embodiment of the image pick-up unit according to the present invention.
Figure 7A:
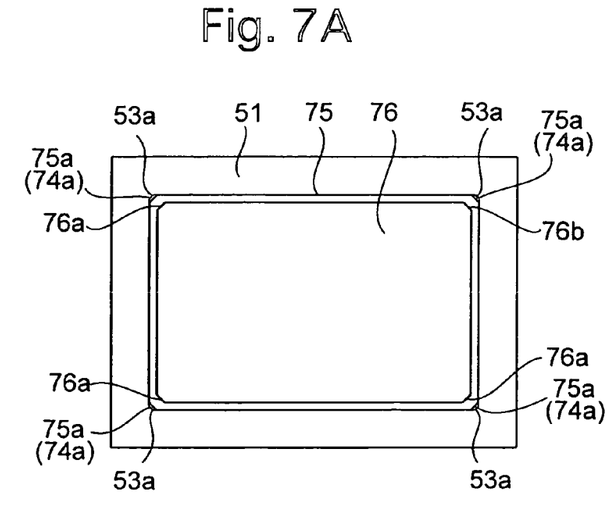
FIG. 7A is a front elevational view of the third embodiment of the image pick-up unit shown in FIG. 6.
Figure 7B:
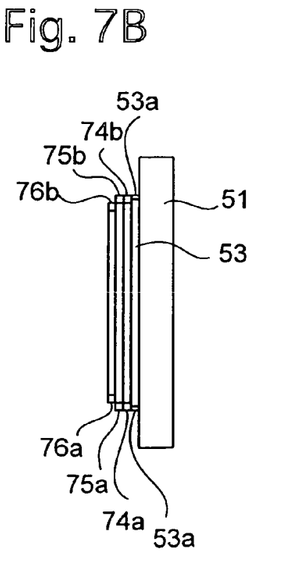
FIG. 7B is a side elevational view of the third embodiment of the image pick-up unit shown in FIG. 6, seen from the right side of the image pick-up unit.

FIGS. 6, 7A and 7B show the third embodiment of the image pick-up unit 50 (50C) according to the present invention. The image pick-up device 51 and the infrared cut-off glass 53, serving as a cover glass in the image pick-up unit 50C of the third embodiment, have the same structures as those in the first embodiment of the image pick-up unit 50A, and are accordingly designated by the same reference numerals.

Similar to the first embodiment shown in FIGS. 2, 3A and 3B, the image pick-up unit 50C of the third embodiment is provided immediately in front of the infrared cut-off glass 53 with a multilayer optical low-pass filter which is cemented to a front surface of the infrared cut-off glass 53. This multilayer optical low-pass filter includes three optical low-pass filters: a rear optical low-pass filter 74, a middle optical low-pass filter 75 cemented to a front surface of the rear optical low-pass filter 74, and a front optical low-pass filter 76 cemented to a front surface of the middle optical low-pass filter 75. Each of the three optical low-pass filters 74, 75 and 76 is formed so that the shape of each optical low-pass filter is asymmetrical with respect to a straight line passing through the center of the optical low-pass filter. A feature of this embodiment is that two of the three optical low-pass filters 74, 75 and 76 have the same shape and size. Specifically, in the illustrated embodiment shown in FIGS. 6, 7A and 7B, the rear optical low-pass filter 74 and the middle optical low-pass filter 75 are the same in shape and size, and the front optical low-pass filter 76, which is positioned closest to the object side (left side as viewed in FIG. 7B) among the three optical low-pass filters 74, 75 and 76, is different in shape and size from the rear optical low-pass filter 74 and the middle optical low-pass filter 75.

The general outer shape of each of the rear optical low-pass filter 74 and the middle optical low-pass filter 75 is rectangular so as to be the same as the general outer shape of the infrared cut-off glass 53. All four corners of each of the three optical low-pass filters 74, 75 and 76 are chamfered so that the surface of each chamfered corner is flat.

Three chamfered corners (a bottom right-hand corner, a top left-hand corner and a bottom left-hand corner as viewed in FIGS. 6 and 7A) 74a among the four chamfered corners of the rear optical low-pass filter 74 are chamfered so that the length of the flat surface of each chamfered corner 74a is greater than the length of the flat surface of each chamfered corner 53a of the infrared cut-off glass 53. The remaining one chamfered corner (top right-hand corner as viewed in FIGS. 6 and 7A) 74b is chamfered (cut out) so that the length of the flat surface of the chamfered corner 74b is greater than the length of the flat surface of each chamfered corner 74a.

Three chamfered corners (a bottom right-hand corner, a top left-hand corner and a bottom left-hand corner as viewed in FIGS. 6 and 7A) 75a among the four chamfered corners of the middle optical low-pass filter 75 are chamfered (cut out) so that the length of the flat surface of each chamfered corner 75a is greater than the length of the flat surface of each chamfered corner 53a of the infrared cut-off glass 53. The remaining one chamfered corner (top right-hand corner as viewed in FIGS. 6 and 7A) 75b is chamfered (cut out) so that the length of the flat surface of the chamfered corner 75b is greater than the length of the flat surface of each chamfered corner 75a and equal to the length of the flat surface of the chamfered corner 74b.

The front optical low-pass filter 76, which is positioned closest to the object side (left side as viewed in FIG. 7B) among the three optical low-pass filters 74, 75 and 76, is formed so that the general outer dimensions (length and width) of the front optical low-pass filter 76 are slightly smaller than those of the remaining two optical low-pass filters 74 and 75. Three chamfered corners (a bottom right-hand corner, a top left-hand corner and a bottom left-hand corner as viewed in FIGS. 6 and 7A) 76a among the four chamfered corners of the front optical low-pass filter 76 are chamfered (cut out) to have a step between two adjacent chamfered corners 75a and 76a in a direction of the thickness of the middle and front optical low-pass filters 75 and 76. In addition, a chamfered corner (a top right-hand corner as viewed in FIGS. 6 and 7A) 76b of the front optical low-pass filter 76 is chamfered (cut out) to have a step between the chamfered corners 75b and 76b in a direction of the thickness of the middle and front optical low-pass filters 75 and 76.

In the image pick-up unit 50C, the front optical low-pass filter 76 can be easily distinguished from the rear optical low-pass filter 74 and the middle optical low-pass filter 75 because only the front optical low-pass filter 76 is different in shape and size from the rear optical low-pass filter 74 and the middle optical low-pass filter 75. Although the middle optical low-pass filter 75 and the front optical low-pass filter 76 are cemented together with the respective centers thereof being aligned when the middle optical low-pass filter 75 and the front optical low-pass filter 76 are cemented together in the image pick-up unit 50C, the middle optical low-pass filter 75 and the front optical low-pass filter 76 can be cemented together with two adjacent sides of one of the middle optical low-pass filter 75 and the front optical low-pass filter 76 being aligned with corresponding two adjacent sides of the other optical low-pass filter 75 or 76. This makes positioning of the two optical low-pass filters 75 and 76 easier.

Although only the outer dimensions (length and width) of the front optical low-pass filter 76, which is positioned closest to the object side (left side as viewed in FIG. 7B) among the three optical low-pass filters 74, 75 and 76, are slightly smaller than those of the remaining two optical low-pass filters 74 and 75 in the image pick-up unit 50C of the third embodiment, the outer dimensions (length and width) of the three optical low-pass filters 74, 75 and 76 can be determined to decrease stepwise in a direction from the infrared cut-off optical glass 53 to the front optical low-pass filter 74. Specifically, if the thickness of each optical low-pass filter is equal to or less than approximately 0.3 mm, the chances of the three optical low-pass filters 74, 75 and 76 being cemented in a wrong order can be reduced by this arrangement, wherein outer dimensions (length and width) of the three optical low-pass filters 74, 75 and 76 decrease stepwise in a direction from the infrared cut-off optical glass 53 to the front optical low-pass filter 74 when the cemented layers of the three optical low-pass filters 74, 75 and 76 are cemented to the infrared cut-off glass 53. In addition, determining the outer dimensions (length and width) of each of the three optical low-pass filters 74, 75 and 76 to be equal to or less than those of the infrared cut-off glass 53 prevents the rear optical low-pass filter 74 from coming off the infrared cut-off glass 53 due to the difference in thermal coefficient of expansion between the rear optical low-pass filter 74 and the-infrared cut-off glass 53.

Each of the above described optical low-pass filters (54, 55, 56, 64, 65, 66, 74, 75 and 76) can be made of any birefringent glass material. Suitable materials are, e.g., quartz, lithium niobate (crystal) and lithium tri-borate (crystal).

Although one of the four corners of each optical low-pass filter is cut out (chamfered) by an amount different from the amount of cutout of each of the remaining three corners to serve as a marking for specifying front and rear sides of each low-pass filter and also a proper orientation of each low-pass filter in each embodiment of the image pick-up unit described above, the shape of the cutout of the one corner is optional.

Figure 8:
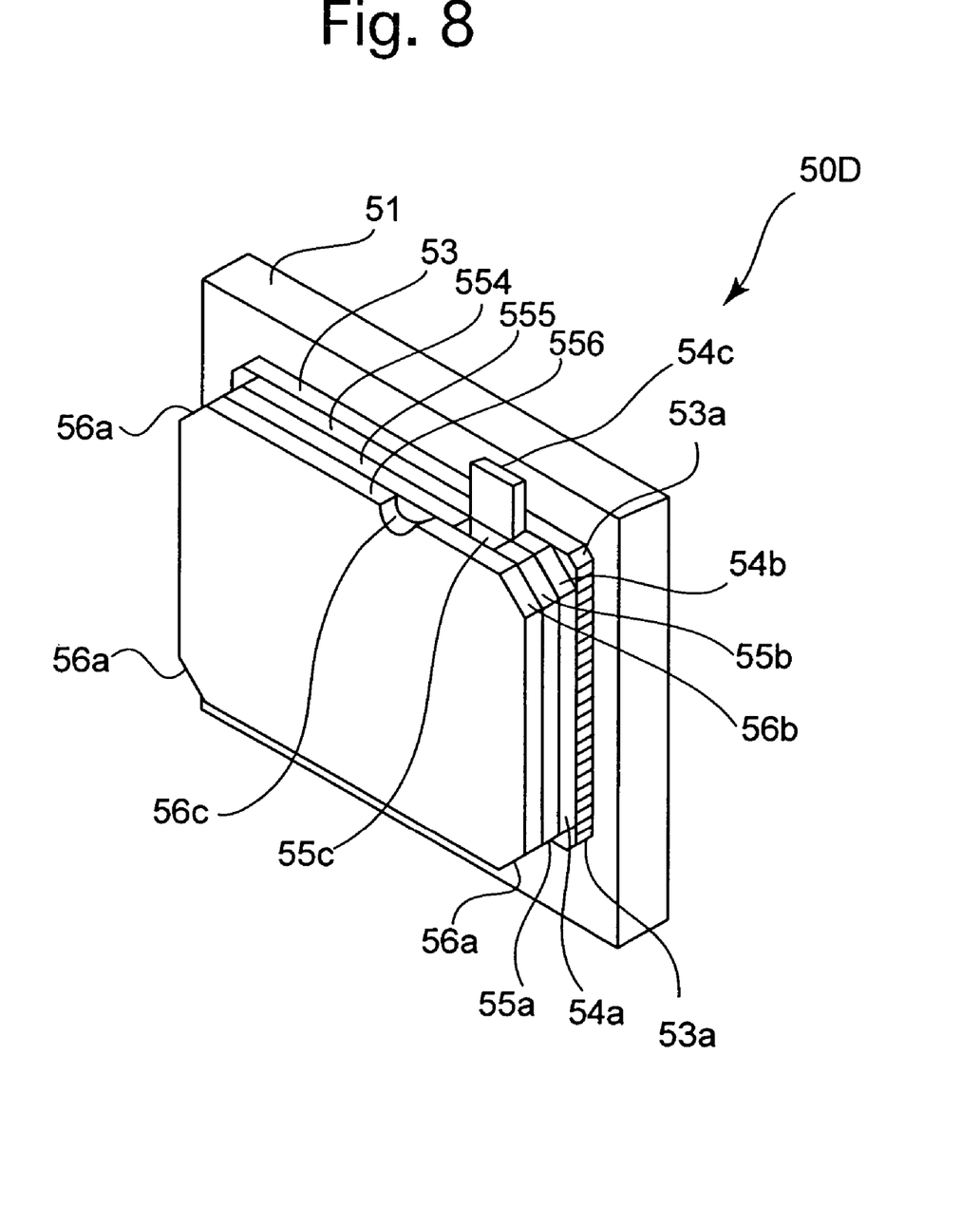
FIG. 8 is a perspective view of a fourth embodiment of the image pick-up unit according to the present invention.

FIG. 8 shows the fourth embodiment of the image pick-up unit 50 (50D) according to the present invention, which is similar to the first embodiment shown in FIGS. 2, 3A and 3B. The image pick-up device 51 and the infrared cut-off glass 53, serving as a cover glass in the image pick-up unit 50D of the fourth embodiment, have the same structures as those in the first embodiment of the image pick-up unit 50A, and are accordingly designated by the same reference numerals.

The image pick-up unit 50D of the fourth embodiment is provided immediately in front of the infrared cutoff glass 53 with a multilayer optical low-pass filter which is cemented to a front surface of the infrared cut-off glass 53. This multilayer optical low-pass filter includes three optical low-pass filters: a rear optical low-pass filter 554, a middle optical low-pass filter 555 cemented to a front surface of the rear optical low-pass filter 554, and a front optical low-pass filter 556 cemented to a front surface of the middle optical low-pass filter 555. The three optical low-pass filters 554, 555 and 556 are chamfered in the same manner as that of the first embodiment. The three optical low-pass filters 554, 555 and 556 which constitute a multilayer optical low-pass filter are formed so that the general outer dimensions of the plurality of optical filters are the same or geometrically similar to each other. As shown in FIG. 8, the rear optical low-pass filter 554 has a projection 54c on an outer edge thereof, the middle optical low-pass filter 555 has a rectangular recess 55c on an outer edge thereof, and the front optical low-pass filter 556 has a round recess 56c on an outer edge thereof. Neither the projection 54c, the rectangular recess 55c, nor the round recess 56c overlaps any other optical filter when the three optical low-pass filters 554, 555 and 556 are cemented together to form the multilayer optical low-pass filter.

As can be understood from the foregoing, according to the present invention, since a plurality of optical filters which are cemented together and positioned in front of the image pick-up device are different in shape from each other, the front surface and the rear surface of each optical filter can be easily distinguished from each other and also a proper orientation of each optical filter can be easily recognized when the optical filters are cemented together. This makes it easy to cement the optical filters together without mistakes.

Since the optical filter among the plurality of optical filters which is positioned closest to the image pick-up device is formed as an infrared cut-off glass serving as a cover glass for covering the front of the image pick-up device, and since the remaining optical filters of the plurality of optical filters are cemented to a front surface of the infrared cut-off glass in each of the above described first through fourth embodiments of the image pick-up devices, the thickness of the image pick-up unit is small, which makes it easy for the image pick-up unit to be installed even in a narrow space such as the image pick-up unit accommodating space 33 of an SLR camera body shown in FIG. 1.

Since the outer dimensions (length and width) of each of the plurality of optical filters are determined to be equal to or less than those of the infrared cut-off glass, or to decrease stepwise in a direction from the infrared cut-off glass toward a side (object side) from which incoming light comes to be incident on the image pick-up device, the plurality of optical filters become resistant to thermal stress cracking and peeling. Consequently, durability and reliability of the plurality of optical filters are increased.

Obvious changes may be made in the specific embodiments of the present invention described herein, such modifications being within the spirit and scope of the invention claimed. It is indicated that all matter contained herein is illustrative and does not limit the scope of the present invention.

What is claimed is:

1. An image pick-up unit comprising:
an image pick-up device; and
a plurality of optical filters which are cemented together to comprise a layered structure and positioned in front of said image pick-up device, at least one of said optical filters having different optical properties and a different shape than at least one other of said optical filters.

2. The image pick-up unit according to claim 1, wherein each optical filter of said plurality of optical filters is asymmetrical with respect to a center of said each optical filter.

3. The image pick-up unit according to claim 1, wherein outer shapes of said plurality of optical filters are geometrically similar to each other, each optical filter of said plurality of optical filters has at least four chamfered corners, and, on each of said optical filters, at least one of said chamfered corners is chamfered by an amount different than the other chamfered corners of the optical filter.

4. The image pick-up unit according to claim 3, wherein outer dimensions of said plurality of optical filters are the same.

5. The image pick-up unit according to claim 1, wherein outer shapes of said plurality of optical filters are geometrically similar to each other, each optical filter of said plurality of optical filters has at least four chamfered corners, and on some, and less than all of said optical filters, at least one of said chamfered corners is chamfered by an amount different than the other chamfered corners of the optical filter.

6. The image pick-up unit according to claim 5, wherein outer dimensions of said plurality of optical filters are the same.

7. The image pick-up unit according to claim 1, wherein outer shapes of said plurality of optical filters are geometrically similar to each other, and
an outer edge of each of said plurality of optical filters comprises one of a projection and a recess which does not overlap an outer edge of another optical filter of said plurality of optical filters when said plurality of optical filters are cemented together.

8. The image pick-up unit according to claim 7, wherein outer dimensions of said plurality of optical filters are the same.

9. The image pick-up unit according to claim 1, wherein outer shapes of said plurality of optical filters are geometrically similar to each other, and
  an outer edge of some, and less than all of said plurality of optical filters includes one of a projection and a recess which does not overlap another optical filter of said plurality of optical filters when said plurality of optical filters are cemented together.

10. The image pick-up unit according to claim 9, wherein outer dimensions of said plurality of optical filters are the same.

11. The image pick-up unit according to claim 1, wherein an optical filter of said plurality of optical filters which is positioned closest to said image pick-up device comprises an infrared cut-off glass comprising a cover glass that covers the front of said image pick-up device to seal said image pick-up device, and wherein each optical filter of said plurality of optical filters other than said infrared cut-off glass comprises an optical low-pass filter.

12. The image pick-up unit according to claim 11, wherein a rear surface of one of said plurality of optical filters which is cemented to a front surface of said infrared cut-off glass is coated with an optically matched filter coating, and wherein at least one surface of the remaining surfaces of said plurality of optical filters is coated with an anti-reflection coating.

13. The image pick-up unit according to claim 11, wherein the length and width of each optical filter of said plurality of optical filters, other than said infrared cut-off glass, are one of equal to and less than the length and width of said infrared cut-off glass, respectively.

14. The image pick-up unit according to claim 11, wherein a thickness of each optical filter of said plurality of optical filters, other than said infrared cut-off glass, is one of equal to and less than approximately 0.3 mm, and for each optical filter, the outer dimensions of said optical filter is less than the outer dimensions of every other optical filter in closer proximity to the infrared cut-off glass.

15. The image pick-up unit according to claim 11, wherein each optical filter of said plurality of optical filters a birefringent glass comprising one of quartz, lithium niobate and lithium tri-borate.

16. The image pick-up unit according to claim 1, wherein said plurality of optical filters, which are cemented together, are cemented to said image pick-up device.

17. The image pick-up unit according to claim 1, wherein each optical filter of said plurality of optical filters is substantially rectangular in shape, each corner of said each optical filter being chamfered.

18. An image pick-up unit comprising:
  an image pick-up device; and
  a plurality of optical filters which are cemented together to comprise a layered structure, and positioned immediately in front of said image pick-up device,
  wherein the length and width of at least one optical filter of said plurality of optical filters is different from the length and width of another optical filter of said plurality of optical filters.

19. An image pick-up unit comprising:
  an image pick-up device; and
  a plurality of optical filters positioned in front of said image pick-up device, each optical filter comprising a plurality of corners chamfered by different amounts.

* * * * *